United States Patent [19]

Kawata et al.

[11] Patent Number: 5,376,497
[45] Date of Patent: Dec. 27, 1994

[54] POSITIVE QUINONE DIAZIDE SULFONIC ACID ESTER RESIST COMPOSITION CONTAINING SELECT HYDROXY COMPOUND ADDITIVE

[75] Inventors: Shoji Kawata; Toshiaki Fujii; Teturyo Kusunoki; Motofumi Kashiwagi; Hiroshi Yagi; Kazuko Koito; Shinya Ikeda, all of Kanagawa, Japan

[73] Assignee: Nippon Zeon Co., Ltd., Tokyo, Japan

[21] Appl. No.: 872,245

[22] Filed: Apr. 22, 1992

[30] Foreign Application Priority Data

Apr. 26, 1991 [JP] Japan ................ 3-124719
Sep. 5, 1991 [JP] Japan ................ 3-254589

[51] Int. Cl.$^5$ ........................... G03F 7/023
[52] U.S. Cl. ........................ 430/191; 430/192
[58] Field of Search ..................... 430/191, 192

[56] References Cited

U.S. PATENT DOCUMENTS 4,931,381  6/1990  Spak et al. ............. 430/191
4,985,333  1/1991  Tokutake et al. ........ 430/191
5,112,719  5/1992  Yamada et al. ......... 430/191

FOREIGN PATENT DOCUMENTS 335836  3/1989  European Pat. Off.
445819  9/1991  European Pat. Off.
1-342195 12/1989 Japan.
2-102314  4/1990 Japan.
2-102315  4/1990 Japan.
1-342194  2/1991 Japan.

*Primary Examiner*—Charles L. Bowers, Jr.
*Assistant Examiner*—Christopher G. Young
*Attorney, Agent, or Firm*—Lowe, Price, LeBlanc & Becker

[57] ABSTRACT

Disclosed herein is a positive resist composition comprising in admixture:

(a) 100 parts by weight of an alkali-soluble phenolic resin;
(b) 1–100 parts by weight of a photosensitive agent formed of a quinonediazide sulfonic acid ester;
(c) 1–100 parts by weight of a hydroxy compound having a structure that at least part of its hydroxyl group(s) (—OH) has been modified by at least one conversion reaction selected from the group consisting of esterification with sulfonic acid (—O—SO$_2$R), esterification with carboxylic acid (—O—COR) and etherification (—O—R), in which R means an alkyl, substituted alkyl, alkenyl, substituted alkenyl, aryl, substituted aryl, aralkyl or substituted aralkyl group; and
(d) sufficient solvent to dissolve the foregoing composition components.

2 Claims, No Drawings

POSITIVE QUINONE DIAZIDE SULFONIC ACID ESTER RESIST COMPOSITION CONTAINING SELECT HYDROXY COMPOUND ADDITIVE

FIELD OF THE INVENTION

The present invention relates to a positive resist composition, and more specifically to a positive resist composition suitable for use in minute processing required for the fabrication of semiconductor devices, magnetic bubble memory devices, integrated circuits and the like.

BACKGROUND OF THE INVENTION

Upon the fabrication of a semiconductor, a semiconductor device is formed by a lithography technique in which a resist is applied onto the surface of a silicon wafer to form a photosensitive film, the film is exposed to light so as to form a latent image and the latent image is then developed to form a negative or positive image. A negative resist composed of cyclized polyisoprene and a bisdiazide compound has heretofore been known as a resist composition for the fabrication of semiconductor devices. However, the negative resist involves a drawback that it cannot be accommodated to the fabrication of semiconductors integrated to high degrees because it is developed with an organic solvent, so that it swells to a significant extent and its resolving power is hence limited.

With the fabrication of highly integrated semiconductors, on the other hand, positive resists, which are developed with an alkali and composed of an alkali-soluble novolak resin and a quinonediazide compound, have come to be widely used because they do not swell and are excellent in resolving power in themselves. It is also possible to form minute patterns of 1 μm or smaller in line width owing to the enhancement of resolution by the improved performance of positive resists and the development of a high-performance aligner.

Incidentally, it is necessary to more rigidly control the dimensions of a resist in the formation of a minute pattern of 1 μm or smaller, particularly 0.8 μm or smaller in line width. However, satisfactory results as to such a requirement are not necessarily obtained from the conventional positive resist compositions. There has been a strong demand for the development of a positive resist composition good in dimensional controllability.

OBJECTS AND SUMMARY OF THE INVENTION

It is an object of this invention to provide a positive resist composition well balanced among various properties such as sensitivity, rate of residual film, resolution, etc. Another object of this invention is to provide a positive resist small in dimensional change according to exposure, i.e., excellent in so-called exposure latitude, in particular, in minute processing to 1 μm or smaller in line width.

The present inventors have carried out an extensive investigation with a view toward overcoming the problems involved in the prior art. As a result, it has been found that when a hydroxy compound having a structure that at least part of its OH group(s) has been modified by at least one conversion reaction selected from the group consisting of esterification with sulfonic acid, esterification with carboxylic acid and etherification is further contained in a positive resist composition comprising an alkali-soluble resin and a photosensitive agent formed of a quinonediazide sulfonic acid ester, the exposure latitude of the resist composition can be notably improved without substantially lowering its sensitivity, rate of residual film and resolution. Such a modified compound undergoes no change in solubility in an aqueous alkali solution when exposed to ultraviolet rays at 300–500 nm.

The present invention has been led to completion on the basis of this finding.

According to the present invention, there is thus provided a positive resist composition comprising in admixture (a) 100 parts by weight of an alkali-soluble phenolic resin; (b) 1–100 parts by weight of a photosensitive agent formed of a quinonediazide sulfonic acid ester; (c) 1–100 parts by weight of a hydroxy compound having a structure that at least part of its hydroxyl group(s) (—OH) has been modified by at least one conversion reaction selected from the group consisting of esterification with sulfonic acid (—OSO$_2$R), esterification with carboxylic acid (—OCOR) and etherification (—O—R), in which R means an alkyl, substituted alkyl, alkenyl, substituted alkenyl, aryl, substituted aryl, aralkyl or substituted aralkyl group, and (d) sufficient solvent to dissolve the foregoing composition components.

DETAILED DESCRIPTION OF THE INVENTION

The features of the present invention will hereinafter be described in detail.

Alkali-Soluble Phenolic Resin (a)

As exemplary alkali-soluble phenolic resins useful in the practice of this invention, may be mentioned condensation products of a phenol and an aldehyde, condensation products of a phenol and a ketone, vinylphenol polymers, isopropenylphenol polymers and hydrogenation products of these phenolic resins.

As specific examples of the phenols usable herein, may be mentioned monohydric phenols such as phenol, cresol, xylenol, ethylphenol, propylphenol, butylphenol and phenylphenol; and polyhydric phenols such as resorcinol, pyrocatechol, hydroquione, bisphenol A, fluoroglucinol and pyrogallol. As specific examples of the aldehydes usable herein, may be mentioned formaldehyde, acetoaldehyde, benzaldehyde and terephthalaldehyde. As specific examples of the ketones usable herein, may be mentioned acetone, methyl ethyl ketone, diethyl ketone and diphenyl ketone. The condensation reactions of their corresponding compounds mentioned above can be separately performed in accordance with the conventional methods.

The vinylphenolic polymer is selected from a homopolymer of vinylphenol and copolymers of vinylphenol and a component copolymerizable therewith. As specific examples of the copolymerizable component, may be mentioned acrylic acid, methacrylic acid, styrene, maleic anhydride, meleimide, vinyl acetate, acrylonitrile and derivatives thereof.

The isopropenylphenolic polymer is selected from a homopolymer of isopropenylphenol and copolymers of isopropenylphenol and a component copolymerizable therewith. As specific examples of the copolymerizable component, may be mentioned acrylic acid, methacrylic acid, styrene, maleic anhydride, meleimide, vinyl acetate, acrylonitrile and derivatives thereof.

When the hydrogenated product of a phenolic resin is used, it can be prepared by any optional known method. For example, the reaction can be achieved by dissolving the phenolic resin in an organic solvent and then introducing hydrogen into the solution in the presence of a homogeneous or heterogeneous hydrogenation catalyst.

Although these alkali-soluble phenolic resins may be used as they are, they may be employed after their molecular weights and molecular weight distributions are controlled by fractionation in accordance with the conventional means or the like, and may be used either singly or in combination.

For example, a copolymer of styrene and acrylic acid, methacrylic acid or maleic anhydride, a copolymer of an alkene and maleic anhydride, a polymer of vinyl alcohol, a polymer of vinylpyrrolidone, rosin, shellac and/or the like may be optionally added to the positive resist composition according to this invention in order to improve its developability, storage stability, heat resistance, etc. The amount of these optional components to be added is 0–50 parts by weight, preferably 5–20 parts by weight per 100 parts by weight of the alkali-soluble phenolic resin.

Photosensitive Agent Formed of Quinonediazide Sulfonic Acid Ester (b)

No particular limitation is imposed on the photosensitive agent useful in the practice of this invention so long as it is a quinonediazide sulfonic acid ester.

Such a quinonediazide sulfonate can be obtained by reacting quinonediazide sulfonic acid with chlorosulfonic acid to form a sulfonyl chloride and condensing the thus-formed sulfonyl chloride with a hydroxy compound in accordance with the conventional method. For example, it can be prepared by dissolving predetermined amounts of a hydroxy compound and 1,2-naphthoquinonediazide-5-sulfonyl chloride in a solvent such as dioxane, acetone or tetrahydrofuran, adding a basic catalyst such as triethylamine, pyridine, sodium carbonate, sodium hydrogencarbonate, sodium hydroxide or potassium hydroxide to the solution to react the reactants, washing the resultant product with water and drying it.

No particular limitation is imposed on the hydroxy compound usable herein. For example, any known compounds having at least one phenolic hydroxyl group may be used. As typical examples of such compounds, may be mentioned polyhydroxybenzophenones such as 2,3,4-trihydroxybenzophenone, 2,4,4'-trihydroxybenzophenone, 2,3,4,4'-tetrahydroxybenzophenone, 2,4,2',4'-tetrahydroxybenzophenone and 2,3,4,2',4'-pentahydroxybenzophenone; gallic acid esters such as methyl gallate, ethyl gallate and propyl gallate; polyhydroxy-bis(phenyl)alkanes such as 2,2-bis(4-hydroxyphenyl)propane and 2,2-bis(2,4-dihydroxyphenyl)propane; polyhydroxy-tris(phenyl)alkanes such as tris(4-hydroxyphenyl)methane and 1,1,1-tris(4-hydroxyphenyl)ethane; etc.

No particular limitation is imposed on the quinonediazide sulfonate moiety of a photosensitive agent useful in the practice of this invention. As examples thereof, may be mentioned o-quinonediazide sulfonates such as 1,2-benzoquinonediazide-4-sulfonate, 1,2-naphthoquinonediazide-4-sulfonate, 1,2-naphthoquinone-diazide-5-sulfonate, 2,1-naphthoquinone-diazide-4-sulfonate and 2,1-naphthoquinonediazide-5-sulfonate, and sulfonates of other quinonediazide derivatives.

The photosensitive agents in this invention may be used either singly or in combination. The proportion of the photosensitive agent is generally 1–100 parts by weight, preferably 3–40 parts by weight per 100 parts by weight of the alkali-soluble phenolic resin. If the proportion should be lower than 1 part by weight, the formation of any patterns will become impossible. On the other hand, any proportions exceeding 100 parts by weight will result in a resist composition lowered in sensitivity, so that the insolubilization of exposed portions will tend to occur upon developing.

Compound (c)

The compound (c) useful in the practice of this invention is a hydroxy compound having a structure that a part or the whole of its hydroxyl group(s) has been modified by at least one conversion reaction selected from the group consisting of esterification with sulfonic acid, esterification with carboxylic acid and etherification. The compound (c) has a structure that a part or the whole of its hydroxyl group(s) has been replaced by their corresponding number of sulfonic ester groups, carboxylic ester groups or ether groups, or combination of these groups. Since this compound is in the form that its hydroxyl group has been modified or protected, it may hereinafter be referred to as "a capped compound".

The hydroxy compound having a structure that at least part of its hydroxyl group(s) has been converted into a sulfonic ester group and/or a carboxylic ester group can be synthesized by reacting a hydroxy compound with a sulfonic acid halide and/or a carboxylic acid halide in the presence of a basic catalyst in the manner similar to the synthesizing method of the quinonediazide sulfonic acid ester. The formation of the carboxylic acid ester may also be performed by reacting the hydroxy compound with an acid anhydride in accordance with any known method.

The hydroxy compound having a structure that at least part of its hydroxyl group(s) has been converted into an ether group can be synthesized by reacting a hydroxy compound with a halogenated compound or dialkylsulfuric acid as an etherifying agent in the presence of a basic catalyst. No particular limitation is imposed on the hydroxy compound used herein. It is however preferable to use a polyhydroxy compound having two or more phenolic hydroxyl groups.

As examples of such a hydroxy compound, may be mentioned hydroxy compounds represented by the following general formulae [I] through [VIII]:

General Formula [I]:

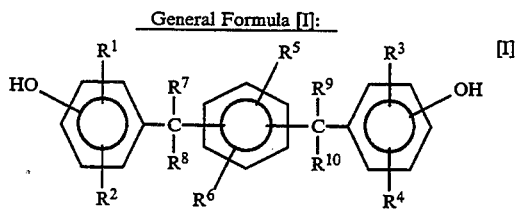

wherein $R^1$ through $R^4$ are selected individually from hydrogen and halogen atoms, a hydroxyl group, alkyl groups having 1–4 carbon atoms and alkenyl groups having 2–5 carbon atoms, $R^5$ and $R^6$ are selected individually from hydrogen and halogen atoms and alkyl groups having 1–4 carbon atoms, and $R^7$ through $R^{10}$ are selected individually from a hydrogen atom and alkyl groups having 1–4 carbon atoms;

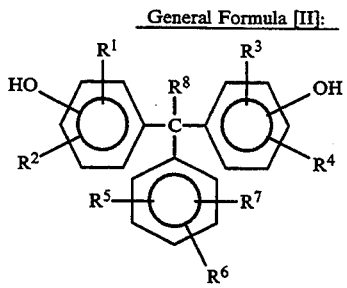

General Formula [II]:

wherein

R[1] through R[7] are selected individually from hydrogen and halogen atoms, a hydroxyl group, alkyl groups having 1–4 carbon atoms, alkenyl groups having 2–5 carbon atoms, and alkoxy and substituted alkoxy groups having 1–6 carbon atoms, and R[8] is a hydrogen atom or an alkyl group having 1–4 carbon atoms;

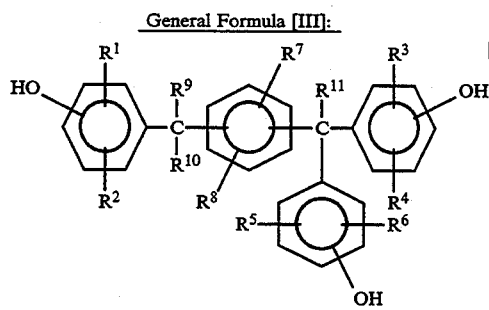

General Formula [III]:

wherein

R[1] through R[6] are selected individually from hydrogen and halogen atoms, a hydroxyl group, alkyl groups having 1–4 carbon atoms and alkenyl groups having 2–5 carbon atoms, R[7] and R[8] are selected individually from hydrogen and halogen atoms and alkyl groups having 1–4 carbon atoms, and R[9] through R[11] are selected individually from a hydrogen atom and alkyl groups having 1–4 carbon atoms;

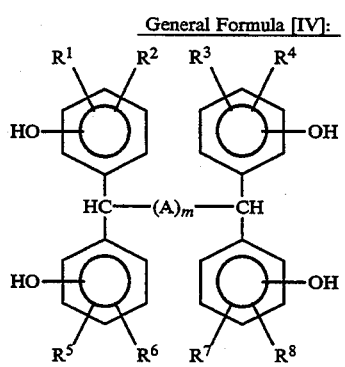

General Formula [IV]:

wherein

R[1] through R[8] are selected individually from hydrogen and halogen atoms, a hydroxyl group, alkyl groups having 1–4 carbon atoms, alkenyl groups having 2–5 carbon atoms, and alkoxy and substituted alkoxy groups having 1–6 carbon atoms, A means an alkylene, substituted alkylene, alkenylene, substituted alkenylene, arylene or substituted arylene group, and m stands for 0 or 1;

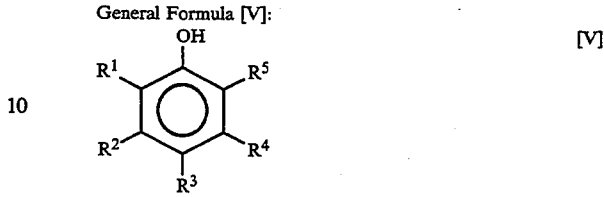

General Formula [V]:

wherein

R[1] through R[5] are selected individually from hydrogen and halogen atoms, a hydroxyl group, alkyl groups having 1–4 carbon atoms, alkenyl groups having 2–5 carbon atoms, alkoxy groups having 1–6 carbon atoms and groups represented by the general formula (V-1):

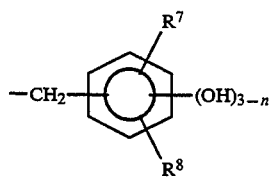

in which R[7] and R[8] are selected individually from hydrogen and halogen atoms, alkyl groups having 1–4 carbon atoms and alkenyl groups having 2–5 carbon atoms, and n stands for 0, 1 or 2, with the proviso that at least one of these groups is the group represented by the general formula (V-1);

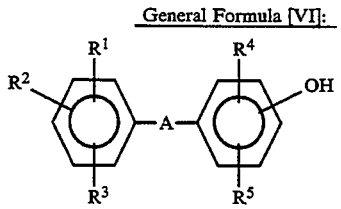

General Formula [VI]:

wherein

A means —S—, —O—, —CO—, —COO—, —SO—, —SO$_2$— or —CR[7]R[8]— in which R[7] and R[8] are selected individually from a hydrogen atom, alkyl groups having 1–4 carbon atoms, alkenyl groups having 2–5 carbon atoms and a phenyl group, and R[1] through R[5] are selected individually from hydrogen and halogen atoms, a hydroxyl group, alkyl groups having 1–4 carbon atoms, alkenyl groups having 2–5 carbon atoms, alkoxy groups having 1–6 carbon atoms and groups represented by the general formula (VI-1):

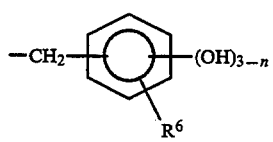

in which R[6] is a hydrogen or halogen atom, an alkyl group having 1–4 carbon atoms or an alkenyl group having 2–5 carbon atoms, and n stands for 0, 1 or 2, with the proviso that at least one of these groups is the group represented by the general formula (VI-1);

General Formula [VII]:

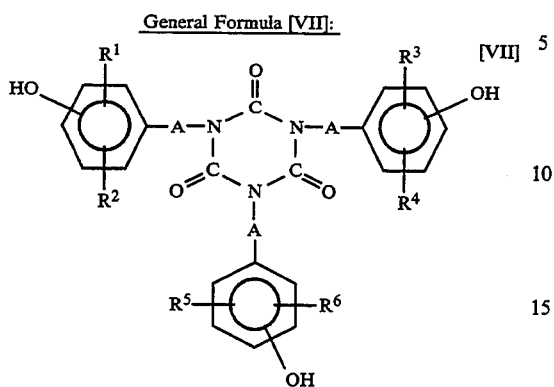

wherein

A means an alkylene, substituted alkylene, alkenylene or substituted alkenylene group, and $R^1$ through $R^6$ are selected individually from hydrogen and halogen atoms, a hydroxyl group, alkyl groups having 1–4 carbon atoms and alkoxy groups having 1–4 carbon atoms;

General Formula [VIII]:

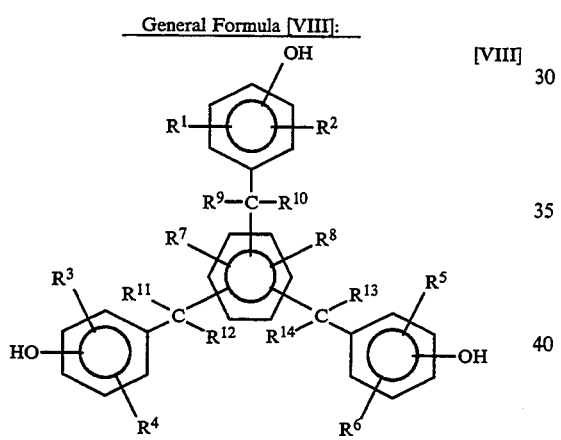

wherein $R^1$ through $R^6$ are selected individually from hydrogen and halogen atoms, a hydroxyl group, alkyl groups having 1–4 carbon atoms and alkenyl groups having 2–5 carbon atoms, $R^7$ and $R^8$ are selected individually from hydrogen and halogen atoms and alkyl groups having 1–4 carbon atoms, and $R^9$ through $R^{14}$ are selected individually from a hydrogen atom and alkyl groups having 1–6 carbon atoms.

Examples of the compound represented by the general formula [I] include those described in Japanese Patent Application No. 342194/1989. As exemplary compounds, may be mentioned the following compounds:

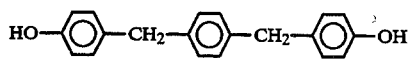

(1)

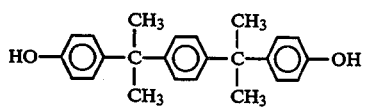

(2)

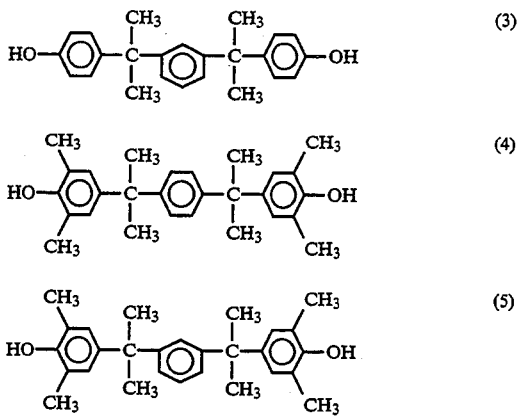

Examples of the compound represented by the general formula [II] include those described in Japanese Patent Application No. 342195/1989. As exemplary compounds, may be mentioned the following compounds:

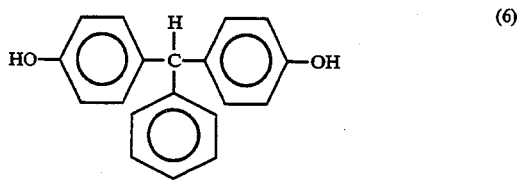

(6)

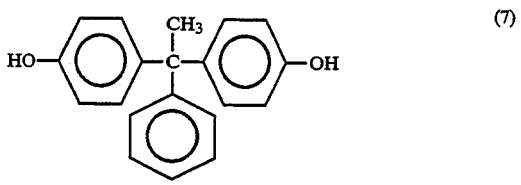

(7)

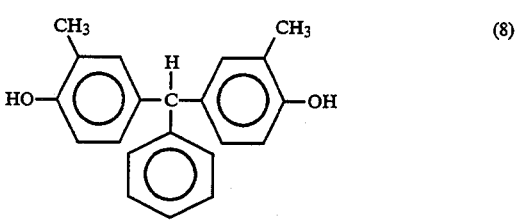

(8)

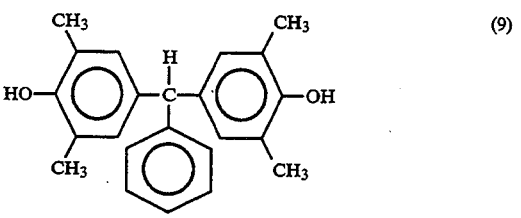

(9)

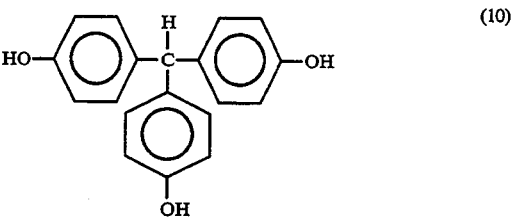

(10)

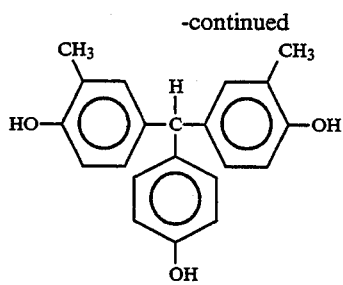
(11)

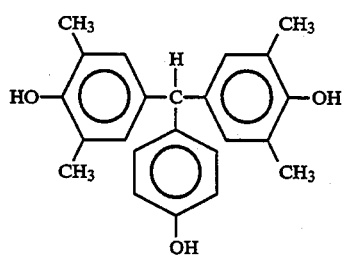
(12)

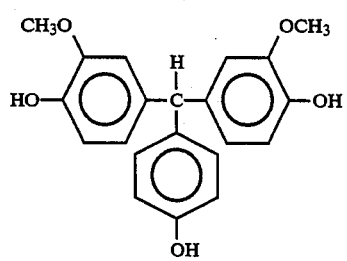
(13)

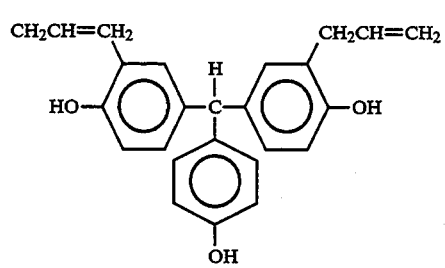
(14)

Examples of the compound represented by the general formula [III] include those described in Japanese Patent Application No. 342193/1989. As exemplary compounds, may be mentioned the following compounds:

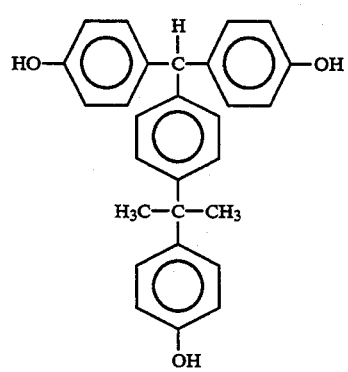
(15)

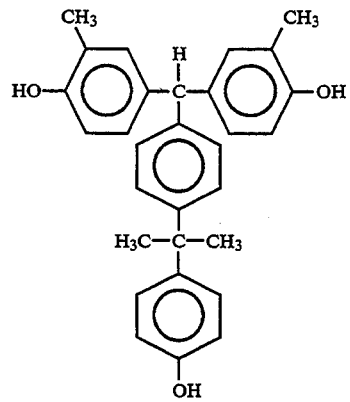
(16)

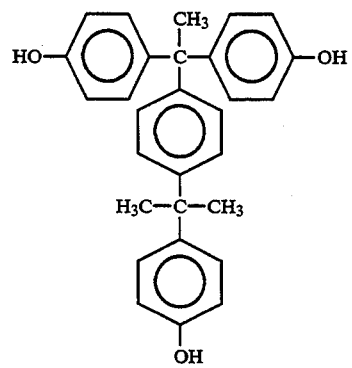
(17)

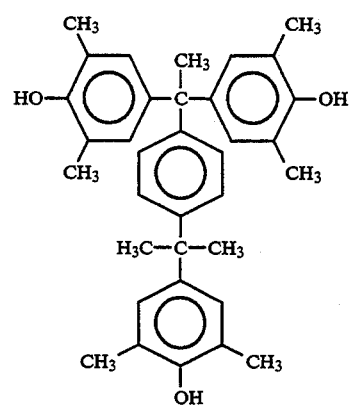
(18)

Examples of the compound represented by the general formula [IV] include those described in Japanese Patent Application Nos. 342195/1989 and 102314/1990. As exemplary compounds, may be mentioned the following compounds:

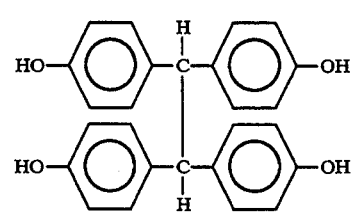
(19)

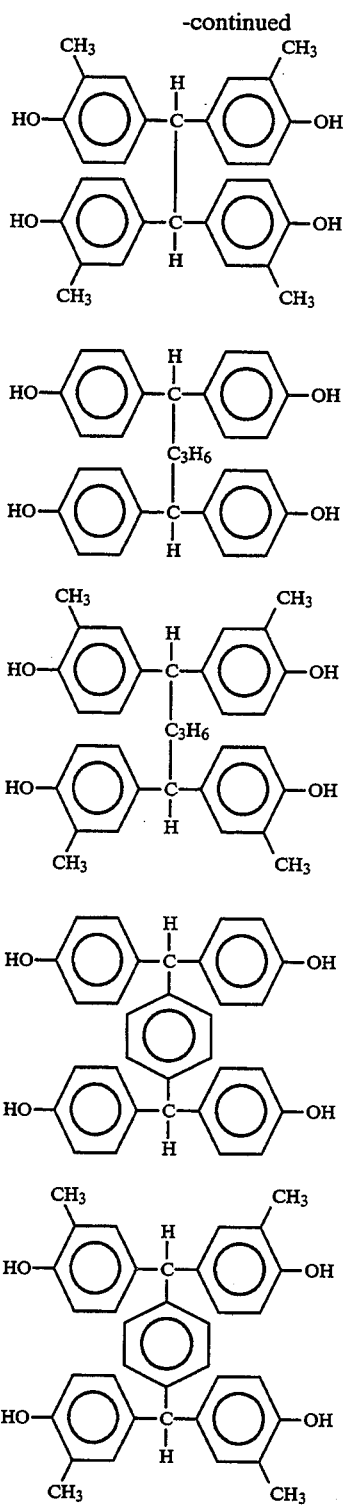

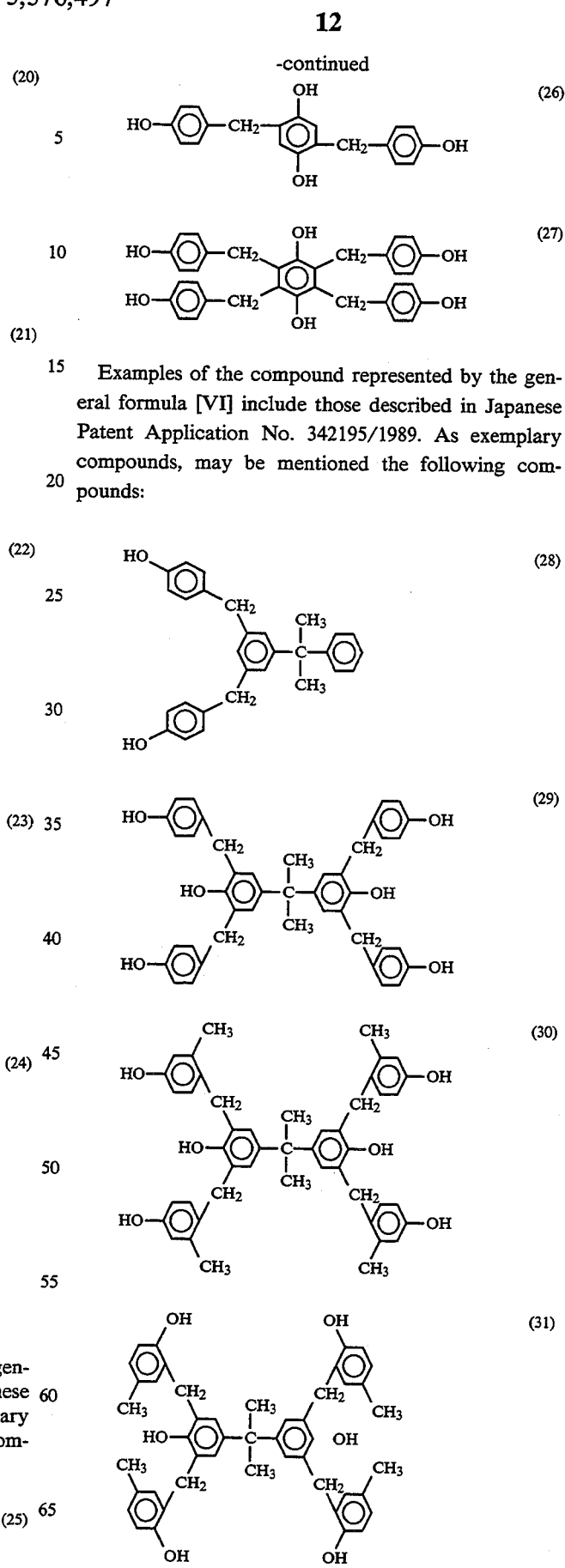

Examples of the compound represented by the general formula [V] include those described in Japanese Patent Application No. 342195/1989. As exemplary compounds, may be mentioned the following compounds:

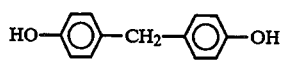

Examples of the compound represented by the general formula [VI] include those described in Japanese Patent Application No. 342195/1989. As exemplary compounds, may be mentioned the following compounds:

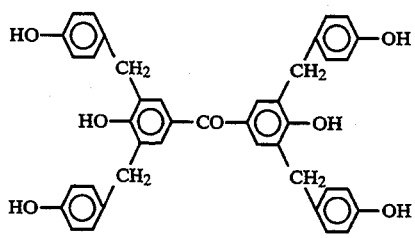  (32)

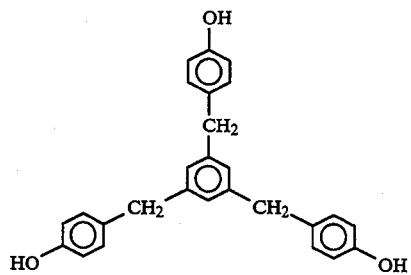  (36)

Examples of the compound represented by the general formula [VII] include those described in Japanese Patent Application No. 102315/1990. As exemplary compounds, may be mentioned the following compounds:

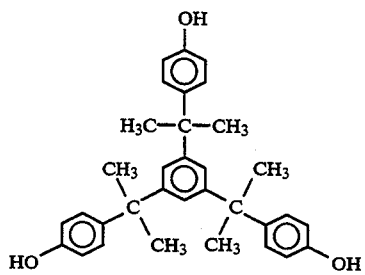  (37)

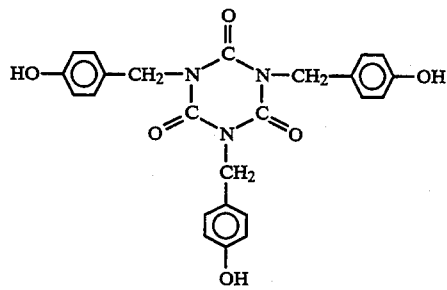  (33)

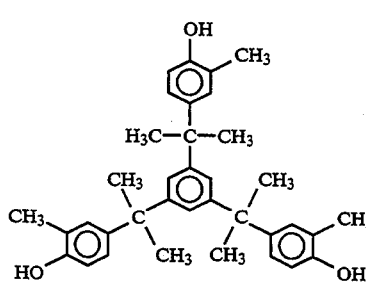  (38)

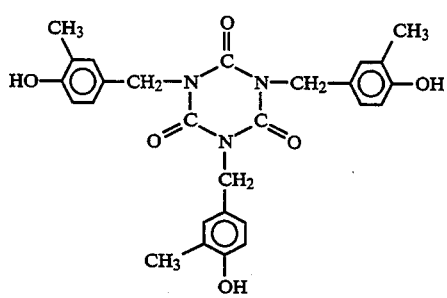  (34)

Incidentally, these hydroxy compounds are used either singly or in combination.

These hydroxy compounds are esterified with a sulfonic or carboxylic acid or etherified on at least part of their hydroxyl groups to introduce therein at least one sulfonate, carboxylate or ether group represented by the following general formula [IX], [X] or [XI]:

—OSO$_2$R  [IX]

—OCOR  [X]

—O—R  [XI]

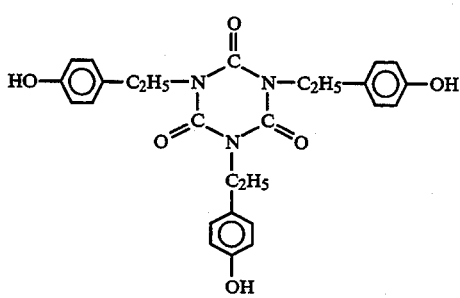  (35)

In each of these formulae, R means an alkyl, substituted alkyl, alkenyl, substituted alkenyl, aryl, substituted aryl, aralkyl or substituted aralkyl group.

The alkyl group preferably has 1–5 carbon atoms. The substituent group on the substituted alkyl group is preferably a halogen atom such as chlorine or bromine by way of example.

The alkenyl group preferably has 2–5 carbon atoms. The substituent group on the substituted alkenyl group is preferably an alkyl group having 1–5 carbon atom or a halogen atom such as chlorine or bromine.

The aryl group is preferably a phenyl or naphthyl group. As exemplary substituent groups on the substituted aryl group, may be mentioned alkyl groups having 1–5 carbon atom, alkenyl groups having 2–5 carbon atoms, alkoxy groups having 1–5 carbon atoms, an acetoamide group, a nitro group, halogen atoms such as chlorine and bromine, a phenyl group and the like. The number of the substituent groups on the substituted aryl group is generally within a range of 1–3. It may be Examples of the compound represented by the general formula [VIII] include those described in Japanese Patent Application No. 342193/1989. As exemplary compounds, may be mentioned the following compounds:

substituted with two or more substituent groups of different kinds.

The aralkyl group is preferably a benzyl or naphthylmethyl group. As exemplary substituent groups on the substituted aralkyl group, may be mentioned those described above as to the substituted aryl group.

No particular limitation is imposed on the sulfonic acid halide and/or carboxylic acid halide used for the formation of the sulfonic acid ester and/or carboxylic acid ester. As specific examples thereof, may be mentioned the following compounds.

Examples of the sulfonic acid halide include alkanesulfonyl halides such as methanesulfonyl chloride, methanesulfonyl fluoride, ethanesulfonyl chloride, n-propanesulfonyl chloride, n-butanesulfonyl chloride and pentanesulfonyl chloride; substituted alkanesulfonyl halides such as chloromethylsulfonyl chloride, dichloromethylsulfonyl chloride, trichloromethylsulfonyl chloride and 2-chloroethylsulfonyl chloride; alkenesulfonyl halides such as ethenesulfonyl chloride and propenesulfonyl chloride; arylsulfonyl halides such as benzenesulfonyl chloride, benzenesulfonyl fluoride, 1-naphthalenesulfonyl chloride and 2-naphthalenesulfonyl chloride; substituted arylsulfonyl halides such as p-toluenesulfonyl chloride, p-ethylbenzenesulfonyl chloride, p-xylenesulfonyl chloride, 2,4,6-tri-isopropylbenzenesulfonyl chloride, p-styrenesulfonyl chloride, p-methoxybenzenesulfonyl chloride, p-dimethylaminobenzenesulfonyl chloride, p-acetoamidobenzenesulfonyl chloride, p-phenylazobenzenesulfonyl chloride, m-nitrobenzenesulfonyl chloride, p-nitrobenzenesulfonyl chloride, p-chlorobenzenesulfonyl chloride and 2,4,5-trichlorobenzenesulfonyl chloride; and the like.

Examples of the carboxylic acid halide include alkane carboxylic acid halides such as acetyl chloride, acetyl bromide, propionyl chloride, propionyl bromide, butyryl chloride, isopropanecarboxylic acid chloride, valeryl chloride and pentanecarboxylic acid chloride; substituted alkane carboxylic acid halides such as chloroacetyl chloride, dichloroacetyl chloride and trichloroacetyl chloride; alkene carboxylic acid halides such as acryloyl chloride and crotonoyl chloride; substituted alkene carboxylic acid halides such as methacryloyl chloride and e-ethylacryloyl chloride; arylcarboxylic acid halides such as benzoyl chloride, benzoyl bromide, 1-naphthoyl chloride and 2-naphthoyl chloride; substituted arylcarboxylic acid halides such as 4-methylbenzoyl chloride, 4-ethylbenzoyl chloride, 2,4-dimethylbenzoyl chloride and 3,4,5-trimethoxybenzoyl chloride; and the like.

As the etherifying agent for etherifying at least part of the hydroxyl groups of the hydroxy compound, are used halogenated compounds and dialkylsulfuric acids. As exemplary halogenated compounds, may be mentioned substituted aryl halides such as α-chloro-p-xylene and 1-chloromethylnaphthalene; aralkyl halides such as α-benzyl chloride; substituted aralkyl halides such as p-methoxybenzyl chloride and p-bromobenzyl bromide; and the like. As exemplary dialkylsulfuric acids, may be mentioned dimethylsulfuric acid and diethylsulfuric acid.

With respect to the hydroxyl groups of the hydroxy compound, the proportion modified by at least one conversion reaction selected from the group consisting of esterification with sulfonic acid, esterification with carboxylic acid and etherification (hereinafter referred to as "percent capping") is generally within a range of 1-100%, preferably 10-100%, more preferably 20-100% on the average.

The compound (c) is rated as being 100% for the percent capping when all the hydroxy groups of the hydroxy compound are modified by any conversion reaction described above. In the other cases, the compound (c) is provided as a mixture of an unmodified hydroxy compound and various capped compounds different in modifying degree. Therefore the percent capping of such a compound (c) is defined as an average value of the modifying degrees as to the hydroxyl groups of the individual compounds in the mixture.

If a reagent used for the esterification with sulfonic or carboxylic acid or the etherification is called a capping agent, the percent capping in the esterification with sulfonic and/or carboxylic acid is concretely calculated from the product (mx) obtained by multiplying the number of moles (x) of the hydroxy compound charged by the number of OH groups (m) thereof, and the number of moles (y) of the capping agent charged in accordance with the following equation:

$$\text{Percent capping} = (y/mx) \times 100 \ (\%)$$

The percent capping in the etherification (may referred to as "percent etherification") can be determined by measuring an area ratio of a proton signal of the hydroxyl group of the etherified hydroxy compound to a proton signal of the ether group thereof by $H^1$-NMR.

The proportion of the compound (c) useful in the practice of this invention is usually within a range of 1-100 parts by weight per 100 parts by weight of the alkali-soluble phenolic resin. Although the preferred range varies according to the kinds of the capped compound, and the alkali-soluble resin and photosensitive agent combined therewith, the proportion is preferably within a range of generally 2-60 parts by weight, more preferably 3-30 parts by weight. If the proportion is too low, the effect of this invention can not be developed. To the contrary, if the proportion is too high, the resolution and heat resistance of the resulting resist composition may be lowered in some cases. The compounds (c) may be used either singly or in combination.

Other Components

The positive resist composition according to this invention is generally used in a state that it is dissolved in a solvent so as to apply it onto a substrate.

As exemplary solvents, may be mentioned ketones such as acetone, methyl ethyl ketone, cyclohexanone and cyclopentanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl lactate and ethyl lactate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in combination.

In the positive resist composition according to this invention, may be contained one or more of compatible additives such as a dye, surfactant, storage stabilizer, another sensitizer, anti-striation agent and plasticizer, as needed.

An aqueous solution of an alkali is used as a developer for the positive resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

ADVANTAGES OF THE INVENTION

According to the present invention, there can be provided positive resist compositions excellent in exposure latitude in particular, and superb in sensitivity, rate of residual film, resolution and dimensional controllability. The positive resist compositions of this invention are suitable in particular for minute processing to 1 μm or smaller in line width.

EMBODIMENTS OF THE INVENTION

The present invention will hereinafter be described more specifically by the following Examples and Comparative Examples. Incidentally, all designations of "part" or "parts" and "%" as will be used in the following Examples mean part or parts by weight and wt. % unless expressly noted.

Incidentally, the following methods were followed for the measurements of the physical properties in the following Examples and Comparative Examples.

(1) Sensitivity

In each resist composition, the sensitivity is expressed in terms of the exposure time required to permit the formation of an equal lines and spaces pattern at intervals of 0.65 μm according to the design pattern.

(2) Resolution

In each resist composition, the resolution is expressed in terms of the critical resolution under the exposure conditions as described above.

(3) Rate of Residual Film

In each resist composition, the rate of residual film is expressed in terms of the ratio of the film thicknesses of the resist composition before and after exposure.

(4) Exposure Latitude

The relationship between the exposure time and the dimension of a pattern at intervals of 0.65 μm in each resist composition is represented graphically to determine the variate in exposure time, in which the variations of the pattern dimension can be kept within ±5% of the design pattern. The exposure latitude is expressed in terms of the quotient found by dividing this variate by the sensitivity of the resist composition.

SYNTHETIC EXAMPLE 1

(Synthesis 1 of Alkali-Soluble Phenolic Resin)

A flask equipped with a condenser tube and a stirrer was charged with a 40/60 mixture of m-cresol/p-cresol, and a 37% aqueous solution of formaline and oxalic acid in amounts of 0.75 mole and 0.03 mole, respectively, per mole of the cresol mixture. The contents were held for 3 hours at 95°–100° C. to react them. Thereafter, the reaction mixture was heated to 100° C. or higher to distill off water over 2 hours, and was distilled under a reduced pressure of 10–30 mmHg while heating it further to 170° C. to remove unreacted monomers and water. The resulting resin melt was then cooled to room temperature to recover the resin. The thus-obtained novolak resin was found to have a polystyrene-reduced weight average molecular weight of 8,800 from the result of the measurement according to gel permeation chromatography (GPC).

SYNTHETIC EXAMPLE 2

(Synthesis 2 of Alkali-Soluble Phenolic Resin)

A flask equipped with a condenser tube and a stirrer was charged with a 50/50 mixture of m-cresol/p-cresol, and a 37% aqueous solution of formaline and oxalic acid in amounts of 0.75 mole and 0.03 mole, respectively, per mole of the cresol mixture. The contents were held for 3 hours at 95°–100° C. to react them. Thereafter, the reaction mixture was heated to 100° C. or higher to distill off water, and was distilled under a reduced pressure of 10–30 mmHg while heating it further to 170° C. to remove unreacted monomers and water. The resulting resin melt was then cooled to room temperature to recover the resin. The thus-obtained novolak resin was found to have a polystyrene-reduced weight average molecular weight of 9,100 from the result of the measurement according to GPC.

SYNTHETIC EXAMPLE 3

(Synthesis of Photosensitive Agent)

2,3,4,4'-Tetrahydroxybenzophenone and 1,2-naphthoquinonediazide-5-sulfonyl chloride in an amount corresponding to 85 mol % of the hydroxyl groups of the benzophenone were dissolved in dioxane into a 10% solution. While controlling the temperature of the solution to 20°–25° C., triethylamine in an amount corresponding to 1.2 equivalents of 1,2-naphthoquinone-diazide-5-sulfonyl chloride was added dropwise to the solution over 30 minutes. The contents were held further for 4 hours at that temperature to complete the reaction. A salt deposited was collected by filtration to pour it into a 0.2% aqueous solution of oxalic acid in an amount 10 times the liquid reaction mixture. Solids deposited were collected by filtration, washed with deionized water and dried under reduced pressure to obtain a photosensitive agent formed of a quinonediazide sulfonic acid ester.

SYNTHETIC EXAMPLE 4

(Synthesis of Compound A)

The compound (17) as a hydroxy compound, which has been described above, and methanesulfonyl chloride as a capping agent in an amount corresponding to 40 mol % of the hydroxyl groups of the compound (17) were dissolved in dioxane into a 10% solution. While controlling the temperature of the solution to 20°-25° C., triethylamine in an amount corresponding to 1.2 equivalents of methanesulfonyl chloride was added dropwise to the solution over 30 minutes. The contents were held further for 6 hours at that temperature to complete the reaction. A salt deposited was collected by filtration to pour it into a 0.2% aqueous solution of oxalic acid in an amount 10 times the liquid reaction mixture. Solids deposited were collected by filtration and dissolved in ethyl ether into a 20% solution. The solution was washed with an equiamount of deionized water and then distilled off to concentrate it and dried under reduced pressure to obtain Compound A.

SYNTHETIC EXAMPLE 5

(Synthesis of Compound B)

The compound (17) as a hydroxy compound and p-toluenesulfonyl chloride as a capping agent in an amount corresponding to 100 mol % of the hydroxyl groups of the compound (17) were dissolved in dioxane into a 10% solution. While controlling the temperature of the solution to 20°-25° C., triethylamine in an amount corresponding to 1.3 equivalents of p-toluenesulfonyl chloride was added dropwise to the solution over 30 minutes. The contents were held further for 6 hours at that temperature to complete the reaction. A salt deposited was collected by filtration to pour it into a 0.2% aqueous solution of oxalic acid in an amount 10 times the liquid reaction mixture. Solids deposited were collected by filtration, washed with deionized water and dried under reduced pressure to obtain Compound B.

SYNTHETIC EXAMPLE 6

(Synthesis of Compounds C through O)

Compounds C through O were synthesized in the same manner as the synthesis of Compound A except that their corresponding hydroxy compounds and capping agents shown in Table 1 were used.

SYNTHETIC EXAMPLE 7

(Synthesis of Etherified Hydroxy Compound a)

A flask was charged with 15.0 g of the hydroxy compound (17) and 49.0 g of a 13% aqueous solution of potassium hydroxide. While controlling the temperature of the resulting mixture to 20°-40° C., 9.6 g of dimethylsulfuric acid was added dropwise to the mixture over 30 minutes. The contents were held further for 4 hours at 20°-25° C. to react them. After completion of the reaction, 36% hydrochloric acid was added dropwise to adjust the pH of the system to 1-2, and a 10% aqueous solution of sodium hydrogencarbonate was then added dropwise to adjust the pH of the system to 7-8. Diethyl ether in an amount of 120 g was added to conduct extraction, and the extract was then washed with 50 g of deionized water. The resulting solution was distilled off to concentrate it and then dried under reduced pressure to obtain 12.7 g of an etherified hydroxy compound (Compound a).

Compound a was dissolved in acetone-$d_6$ into a solution to conduct $H^1$-NMR measurement. A percent etherification of this compound was calculated from an area ratio of a proton signal of the unreacted hydroxyl group to a methyl proton signal of the methyl ether group and was found to be 65%.

SYNTHETIC EXAMPLE 8

(Synthesis of Etherified Hydroxy Compounds b and c)

Compounds b and c were synthesized in the same manner as the synthesis of Compound a in Synthetic Example 7 except that their corresponding hydroxy compounds and etherifying agents shown in Table 3 were used and their charged proportions were changed. Their percent etherifications determined according to $H^1$-NMR measurement are shown in Table 3.

SYNTHETIC EXAMPLE 9

(Synthesis of Etherified Hydroxy Compound d)

A flask was charged with 15.0 g of the hydroxy compound (17), 17.0 g of benzyl chloride, 22.4 g of anhydrous potassium carbonate and 90 g of dimethylformamide to dissolve solid contents. The resulting solution was held for 4 hours at 60° C. to conduct reaction. After completion of the reaction, 36% hydrochloric acid was added dropwise to adjust the pH of the system to 2-3, and a 10% aqueous solution of sodium hydrogencarbonate was then added dropwise to adjust the pH of the system to 7-8. Deposits were collected by filtration and then dissolved in 260 g of diethyl ether. The solution was washed five times with 110 g of deionized water. The thus-washed solution was distilled off to concentrate it and further dried under reduced pressure to conduct $H^1$-NMR measurement. A percent etherification of the resulting compound was calculated from an area ratio of a proton signal of the unreacted hydroxyl group to a methylene proton signal of the benzyl ether group and was found to be 78%.

SYNTHETIC EXAMPLE 10

(Synthesis of Etherified Hydroxy Compounds e through h)

Compounds e through h were synthesized in the same manner as the synthesis of Compound d in Synthetic Example 9 except that their corresponding hydroxy compounds and etherifying agents shown in Table 3 were used and their charged proportions were changed. Their percent etherifications determined according to $H^1$-NMR measurement are shown in Table 3.

SYNTHETIC EXAMPLE 11

(Synthesis of Etherified Hydroxy Compounds i through o)

Compounds i through o were synthesized in the same manner as the synthesis of Compound a in Synthetic Example 7 except that their corresponding hydroxy compounds shown in Table 3 and dimethylsulfuric acid as an etherifying agent were used and their charged proportions were changed. Their percent etherifications determined according to $H^1$-NMR measurement are shown in Table 3.

EXAMPLE 1

In 350 parts of ethyl lactate, were dissolved 100 parts of the novolak resin obtained in Synthetic Example 1, 25 parts of the photosensitive agent obtained in Synthetic Example 3 and Compound A. The resulting solution was filtered through a Teflon filter (polytetrafluoroethylene filter) having a pore size of 0.1 μm to prepare a resist solution.

After applying the resist solution by a coater onto a silicon wafer, the resist solution was pre-baked for 90 seconds at 90° C., thereby forming a resist film having a thickness of 1.17 μm. The thus-formed resist film was exposed using the g-line stepper, "NSR-1505G6E" (manufactured by Nikon Corp., NA=0.54) and a test reticle while varying exposure time. The thus-exposed film was then subjected to post-exposure baking for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe through an electron microscope, thereby inspecting the formation and dimensions of the pattern to evaluate its resist performance. The results are shown in Table 2.

EXAMPLES 2-14

Resist solutions were prepared in the same manner as in Example 1 except that Compound C through O were respectively used in place of Compound A. The results are shown in Table 2.

EXAMPLE 15

In 350 parts of ethyl lactate, were dissolved 100 parts of the novolak resin obtained in Synthetic Example 1, 25 parts of the photosensitive agent obtained in Synthetic Example 3, 1.25 parts of Compound B and 3.75 parts of the hydroxy compound (17) described above. The resulting solution was filtered through a Teflon filter having a pore size of 0.1 μm to prepare a resist solution.

The thus-obtained resist solution was evaluated as to its resist performance in the same manner as in Example 1. The results are shown in Table 2.

COMPARATIVE EXAMPLE 1

A resist solution was prepared in the same manner as in Example 1 except that the hydroxy compound (17) was used instead of Compound A, and then evaluated. The results are shown in Table 2.

COMPARATIVE EXAMPLE 2

A resist solution was prepared in the same manner as in Example 1 except that no Compound A was used, and then evaluated. The results are shown in Table 2.

TABLE 1

| Compound | Phenolic compound | Capping agent | Percent capping (%) |
|---|---|---|---|
| A | (17) | Methanesulfonyl chloride | 40 |
| B | (17) | P-Toluenesulfonyl chloride | 100 |
| C | (17) | P-Toluenesulfonyl chloride | 25 |
| D | (17) | P-Methoxybenzenesulfonyl chloride | 20 |
| E | (17) | Acetyl chloride | 50 |
| F | (17) | Acryloyl chloride | 50 |
| G | (17) | Benzoyl chloride | 40 |
| H | (17) | 3,4,5-Trimethoxybenzoyl chloride | 30 |
| I | (3) | P-Toluenesulfonyl chloride | 40 |
| J | (10) | P-Toluenesulfonyl chloride | 33 |
| K | (23) | P-Toluenesulfonyl chloride | 30 |
| L | (27) | P-Toluenesulfonyl chloride | 33 |

TABLE 1-continued

| Compound | Phenolic compound | Capping agent | Percent capping (%) |
|---|---|---|---|
| M | (29) | P-Toluenesulfonyl chloride | 40 |
| N | (33) | P-Toluenesulfonyl chloride | 20 |
| O | (37) | P-Toluenesulfonyl chloride | 25 |

TABLE 2

| | Compound | | Sensitivity (msec) | RRF*1 (%) | Resolution (μm) | Exposure latitude |
|---|---|---|---|---|---|---|
| | Kind | Wt. part | | | | |
| Ex. 1 | A | 5 | 360 | 99 | 0.45 | 0.22 |
| Ex. 2 | C | 5 | 380 | 99 | 0.45 | 0.21 |
| Ex. 3 | D | 5 | 380 | 100 | 0.45 | 0.19 |
| Ex. 4 | E | 5 | 400 | 99 | 0.45 | 0.20 |
| Ex. 5 | F | 5 | 380 | 99 | 0.45 | 0.19 |
| Ex. 6 | G | 5 | 380 | 99 | 0.45 | 0.19 |
| Ex. 7 | H | 5 | 380 | 100 | 0.45 | 0.20 |
| Ex. 8 | I | 5 | 420 | 99 | 0.45 | 0.22 |
| Ex. 9 | J | 5 | 360 | 99 | 0.45 | 0.20 |
| Ex. 10 | K | 5 | 340 | 99 | 0.45 | 0.19 |
| Ex. 11 | L | 5 | 380 | 99 | 0.45 | 0.22 |
| Ex. 12 | M | 5 | 380 | 99 | 0.45 | 0.19 |
| Ex. 13 | N | 5 | 420 | 99 | 0.45 | 0.18 |
| Ex. 14 | O | 5 | 420 | 100 | 0.45 | 0.21 |
| Ex. 15 | B (17) | 1.25 3.75 | 400 | 99 | 0.50 | 0.17 |
| Comp. Ex. 1 | (17) | 5 | 300 | 99 | 0.50 | 0.13 |
| Comp. Ex. 2 | Not added | | 420 | 99 | 0.50 | 0.13 |

*1Rate of residual film

EXAMPLE 16

In 350 parts of ethyl lactate, were dissolved 100 parts of the novolak resin obtained in Synthetic Example 2, 25 parts of the photosensitive agent obtained in Synthetic Example 3 and 5 parts of Compound a. The resulting solution was filtered through a Teflon filter having a pore size of 0.1 μm to prepare a resist solution.

After applying the resist solution by a coater onto a silicon wafer, the resist solution was pre-baked for 90 seconds at 90° C., thereby forming a resist film having a thickness of 1.17 μm. The thus-formed resist film was exposed using the g-line stepper, "NSR-1505G6E" (manufactured by Nikon Corp., NA=0.54) and a test reticle while varying exposure time. The thus-exposed film was then subjected to post-exposure baking for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe through an electron microscope, thereby inspecting the formation and dimensions of the pattern to evaluate its resist performance. The results are shown in Table 4.

EXAMPLES 17-29

Resist solutions were prepared in the same manner as in Example 16 except that Compound c through o were respectively used in place of Compound a. The results are shown in Table 4.

EXAMPLE 30

In 350 parts of ethyl lactate, were dissolved 100 parts of the novolak resin obtained in Synthetic Example 2, 25 parts of the photosensitive agent obtained in Synthetic Example 3, 3 parts of Compound c and 2 parts of the hydroxy compound (17) described above. The resulting solution was filtered through a Teflon filter having a pore size of 0.1 μm to prepare a resist solution.

The thus-obtained resist solution was evaluated as to its resist performance in the same manner as in Example 16. The results are shown in Table 4.

COMPARATIVE EXAMPLE 3

A resist solution was prepared in the same manner as in Example 16 except that the hydroxy compound (17) was used instead of Compound a, and then evaluated. The results are shown in Table 4.

COMPARATIVE EXAMPLE 4

A resist solution was prepared in the same manner as in Example 16 except that no Compound a was used, and then evaluated. The results are shown in Table 4.

TABLE 3

| Compound | Phenolic compound | Ether group (Etherifying agent) | Percent etherification (%) |
|---|---|---|---|
| a | (17) | Methyl (Dimethylsulfuric acid) | 65 |
| b | (17) | Methyl (Dimethylsulfuric acid) | 97 |
| c | (17) | Methyl (Dimethylsulfuric acid) | 53 |
| d | (17) | Benzyl (α-Benzyl chloride) | 78 |
| e | (17) | p-Methylbenzyl (α-Chloro-p-xylene) | 50 |
| f | (17) | p-Methoxybenzyl (p-Methoxybenzyl chloride) | 42 |
| g | (17) | p-Bromobenzyl (p-Brobobenzyl bromide) | 39 |
| h | (17) | 1-Naphthylmethyl (1-Chloromethyl-naphthalene) | 29 |
| i | (3) | Methyl (Dimethylsulfuric acid) | 43 |
| j | (10) | Methyl (Dimethylsulfuric acid) | 73 |
| k | (23) | Methyl (Dimethylsulfuric acid) | 74 |
| l | (27) | Methyl (Dimethylsulfuric acid) | 69 |
| m | (29) | Methyl (Dimethylsulfuric acid) | 60 |
| n | (33) | Methyl (Dimethylsulfuric acid) | 54 |
| o | (37) | Methyl (Dimethylsulfuric acid) | 58 |

TABLE 4

| | Compound | | Sensitivity (msec) | RRF*1 (%) | Resolution (μm) | Exposure latitude |
|---|---|---|---|---|---|---|
| | Kind | Wt. part | | | | |
| Ex. 16 | a | 5 | 540 | 100 | 0.45 | 0.23 |
| Ex. 17 | c | 5 | 500 | 100 | 0.45 | 0.21 |
| Ex. 18 | d | 5 | 700 | 100 | 0.45 | 0.25 |
| Ex. 19 | e | 5 | 480 | 100 | 0.45 | 0.22 |
| Ex. 20 | f | 5 | 520 | 100 | 0.45 | 0.22 |
| Ex. 21 | g | 5 | 480 | 100 | 0.45 | 0.18 |
| Ex. 22 | h | 5 | 480 | 100 | 0.45 | 0.18 |
| Ex. 23 | i | 5 | 520 | 100 | 0.45 | 0.20 |
| Ex. 24 | j | 5 | 520 | 100 | 0.45 | 0.23 |
| Ex. 25 | k | 5 | 500 | 100 | 0.45 | 0.20 |
| Ex. 26 | l | 5 | 480 | 99 | 0.45 | 0.18 |
| Ex. 27 | m | 5 | 480 | 100 | 0.45 | 0.19 |
| Ex. 28 | n | 5 | 480 | 100 | 0.45 | 0.20 |
| Ex. 29 | o | 5 | 520 | 100 | 0.45 | 0.24 |
| Ex. 30 | b | 3 | 520 | 100 | 0.45 | 0.22 |
| | (17) | 2 | | | | |
| Comp. Ex. 3 | (17) | 2 | 380 | 99 | 0.45 | 0.14 |
| Comp. Ex. 4 | Not added | | 400 | 99 | 0.45 | 0.11 |

*1Rate of residual film

What is claimed is:

1. A positive resist composition comprising in admixture:

(a) 100 parts by weight of an alkali-soluble phenolic resin;

(b) 1-100 parts by weight of a photosensitive agent formed of a quinonediazide sulfonic acid ester;

(c) 1-100 parts by weight of a hydroxy compound having a structure that at least part of its hydroxyl group(s) (—OH) has been modified by at least one conversion reaction selected from the group consisting of esterification with sulfonic acid (—O—SO$_2$R), esterification with carboxylic acid (—O—COR) and etherification (—O—R), in which R represents an alkyl, substituted alkyl, alkenyl, substituted alkenyl, aryl, substituted aryl, aralkyl or substituted aralkyl group, said hydroxy compound being a polyhydroxy compound having at least two phenolic hydroxy groups, and undergoing no change in solubility in an aqueous alkali solution when exposed to ultraviolet rays at 300–500 nm;

wherein the polyhydroxy compound having at least phenolic hydroxyl groups is at least one polyhydroxy compound selected from the group consisting of the following general formulae (I) through (VIII):

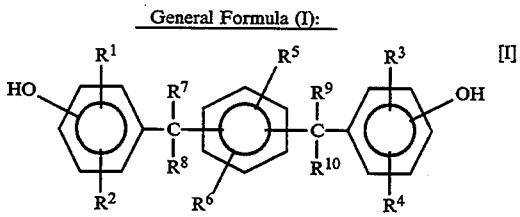

General Formula (I):

wherein

R$^1$ through R$^4$ are selected individually from hydrogen and halogen atoms, a hydroxyl group, alkyl groups having 1–4 carbon atoms and alkenyl groups having 2–5 carbon atoms, R$^5$ and R$^6$ are selected individually from hydrogen and halogen atoms and alkyl groups having 1–4 carbon atoms, and R$^7$ through R$^{10}$ are selected individually from a hydrogen atom and alkyl groups having 1–4 carbon atoms;

General Formula (II):

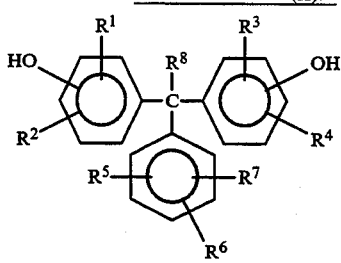

wherein
$R^1$ through $R^7$ are selected individually from hydrogen and halogen atoms, a hydroxyl group, alkyl groups having 1–4 carbon atoms, alkenyl groups having 2–5 carbon atoms, and alkoxy and substituted alkoxy groups having 1–6 carbon atoms, and
$R^8$ is a hydrogen atom or an alkyl group having 1–4 carbon atoms;

General Formula (III):

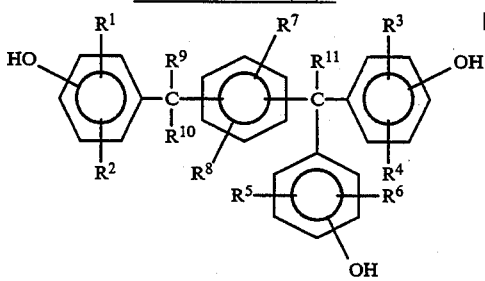

wherein
$R^1$ through $R^6$ are selected individually from hydrogen and halogen atoms, a hydroxyl group, alkyl groups having 1–4 carbon atoms and alkenyl groups having 2–5 carbon atoms,
$R^7$ and $R^8$ are selected individually from hydrogen and halogen atoms and alkyl groups having 1–4 carbon atoms, and
$R^9$ through $R^{11}$ are selected individually from a hydrogen atom and alkyl groups having 1–4 carbon atoms;

General Formula (IV):

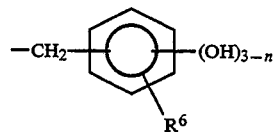

wherein
$R^1$ through $R^8$ are selected individually from hydrogen and halogen atoms, a hydroxyl group, alkyl groups having 1–4 carbon atoms, alkenyl groups having 2–5 carbon atoms, and alkoxy and substituted alkoxy groups having 1–6 carbon atoms, A represents an alkylene, substituted alkylene, alkenylene, substituted alkenylene, arylene or substituted arylene group, and
m represents 0 or 1;

General Formula (VI):

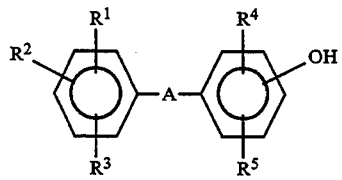

wherein
A represents —S—, —O—, —CO—, —COO—, —SO—, —SO$_2$— or —CR$^7$R$^8$— in which $R^7$ and $R^8$ are selected individually from a hydrogen atom, alkyl groups having 1–4 carbon atoms, alkenyl groups having 2–5 carbon atoms and a phenyl group, and
$R^1$ through $R^5$ are selected individually from hydrogen and halogen atoms, a hydroxyl group, alkyl groups having 1–4 carbon atoms, alkenyl groups having 2–5 carbon atoms, alkoxy groups having 1–6 carbon atoms and groups represented by the general formula (VI-1):

[VI-1]

—CH$_2$—⬡—(OH)$_{3-n}$
       |
       $R^6$ in which $R^6$ is a hydrogen or halogen atom, an alkyl group having 1–4 carbon atoms or an alkenyl group having 2–5 carbon atoms, and n represents 0, 1 or 2, with the proviso that at least one of these groups is the group represented by the general formula (VI-1);

General Formula (VII):

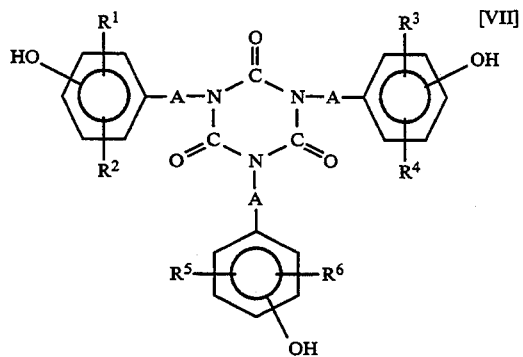

wherein
A represents an alkylene, substituted alkylene, alkenylene or substituted alkenylene group, and
$R^1$ through are $R^6$ selected individually from hydrogen and halogen atoms, a hydroxyl group, alkyl groups having 1–4 carbon atoms and alkoxy groups having 1–4 carbon atoms;

General Formula (VIII):

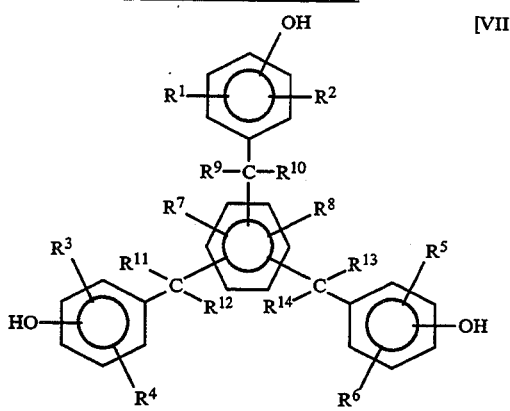

[VIII]

wherein $R^1$ through $R^6$ are selected individually from hydrogen and halogen atoms, a hydroxyl group, alkyl groups having 1–4 carbon atoms and alkenyl groups having 2–5 carbon atoms, $R^7$ and $R^8$ are selected individually from hydrogen and halogen atoms and alkyl groups having 1–4 carbon atoms, and $R^9$ through $R^{14}$ are selected individually from a hydrogen atom and alkyl groups having 1–6 carbon atoms;

(d) sufficient solvent to dissolve the foregoing composition components.

2. The positive resist composition according to claim 1, wherein the hydroxyl groups of the hydroxy compound are modified in a proportion of 1–100% on the average by the conversion reaction.

General Formula (IV):

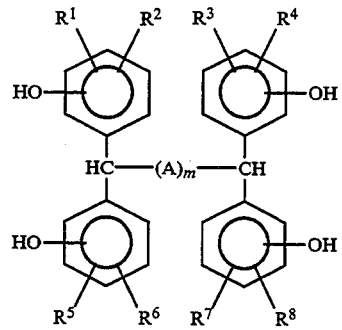

[IV]

General Formula (VIII):

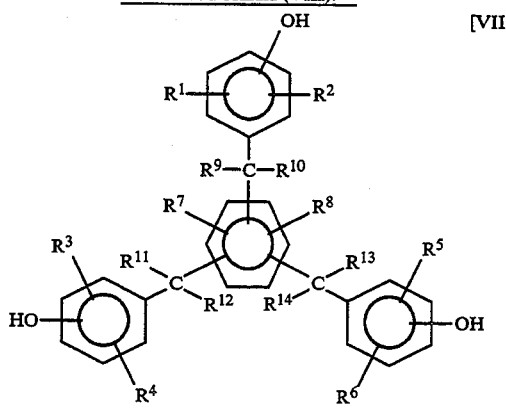

[VIII]

* * * * *